(12) United States Patent
MacElwee et al.

(10) Patent No.: US 8,198,638 B2
(45) Date of Patent: *Jun. 12, 2012

(54) LIGHT EMITTING DEVICE STRUCTURE AND PROCESS FOR FABRICATION THEREOF

(75) Inventors: Thomas MacElwee, Nepean (CA); Alasdair Rankin, Ottawa (CA)

(73) Assignee: Group IV Semiconductor Inc., Kanata (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/835,810

(22) Filed: Jul. 14, 2010

(65) Prior Publication Data

US 2010/0276720 A1 Nov. 4, 2010

Related U.S. Application Data

(63) Continuation-in-part of application No. 12/015,285, filed on Jan. 16, 2008, now Pat. No. 7,888,686, which is a continuation-in-part of application No. 11/642,813, filed on Dec. 21, 2006, now Pat. No. 7,800,117.

(60) Provisional application No. 60/754,185, filed on Dec. 28, 2005.

(51) Int. Cl.
*H01L 33/06* (2010.01)
*H01L 21/00* (2006.01)

(52) U.S. Cl. ............... 257/79; 257/80; 257/94; 257/98; 257/100; 257/E33.001; 257/E33.068; 257/E33.07; 257/E33.011; 438/22; 438/38; 438/47; 438/48

(58) Field of Classification Search .................... 257/79, 257/80, 94, 98, 100, E33.001, E33.068, E33.07, 257/E33.011; 438/22, 38, 47, 48
See application file for complete search history.

(56) References Cited

U.S. PATENT DOCUMENTS

| | | | | |
|---|---|---|---|---|
| 5,249,195 A | * | 9/1993 | Feldman et al. | 372/45.01 |
| 5,517,039 A | * | 5/1996 | Holonyak et al. | 257/94 |
| 6,455,870 B1 | * | 9/2002 | Wang et al. | 257/12 |
| 6,815,731 B2 | * | 11/2004 | Sato | 257/103 |
| 7,569,862 B2 | * | 8/2009 | Johnson et al. | 257/94 |
| 7,800,117 B2 | * | 9/2010 | Chik et al. | 257/79 |
| 7,858,992 B2 | * | 12/2010 | Ueta et al. | 257/79 |
| 7,888,686 B2 | * | 2/2011 | Chik et al. | 257/79 |
| 7,923,925 B2 | * | 4/2011 | MacElwee et al. | 313/506 |
| 2005/0199892 A1 | * | 9/2005 | Cho et al. | 257/87 |
| 2008/0093608 A1 | | 4/2008 | Chik et al. | |
| 2008/0246046 A1 | | 10/2008 | Chik et al. | |
| 2010/0032687 A1 | | 2/2010 | Calder et al. | |

* cited by examiner

*Primary Examiner* — Dao H Nguyen
(74) *Attorney, Agent, or Firm* — Neil Teitelbaum; Doug MacLean

(57) ABSTRACT

A light emitting device structure, wherein the emitter layer structure comprises one or more device wells defined by thick field oxide regions, and a method of fabrication thereof are provided. Preferably, by defining device well regions after depositing the emitter layer structure, emitter layer structures with reduced topography may be provided, facilitating processing and improving layer to layer uniformity. The method is particularly applicable to multilayer emitter layer structures, e.g. comprising a layer stack of active layer/drift layer pairs. Preferably, active layers comprise a rare earth oxide, or rare earth doped dielectric such as silicon dioxide, silicon nitride, or silicon oxynitride, and respective drift layers comprise a suitable dielectric, preferably silicon dioxide, of an appropriate thickness to control excitation energy. Pixellated light emitting structures, or large area, high brightness emitter layer structures, e.g. for solid-state lighting applications, may therefore be provided with improved process flexibility and reliability.

25 Claims, 8 Drawing Sheets

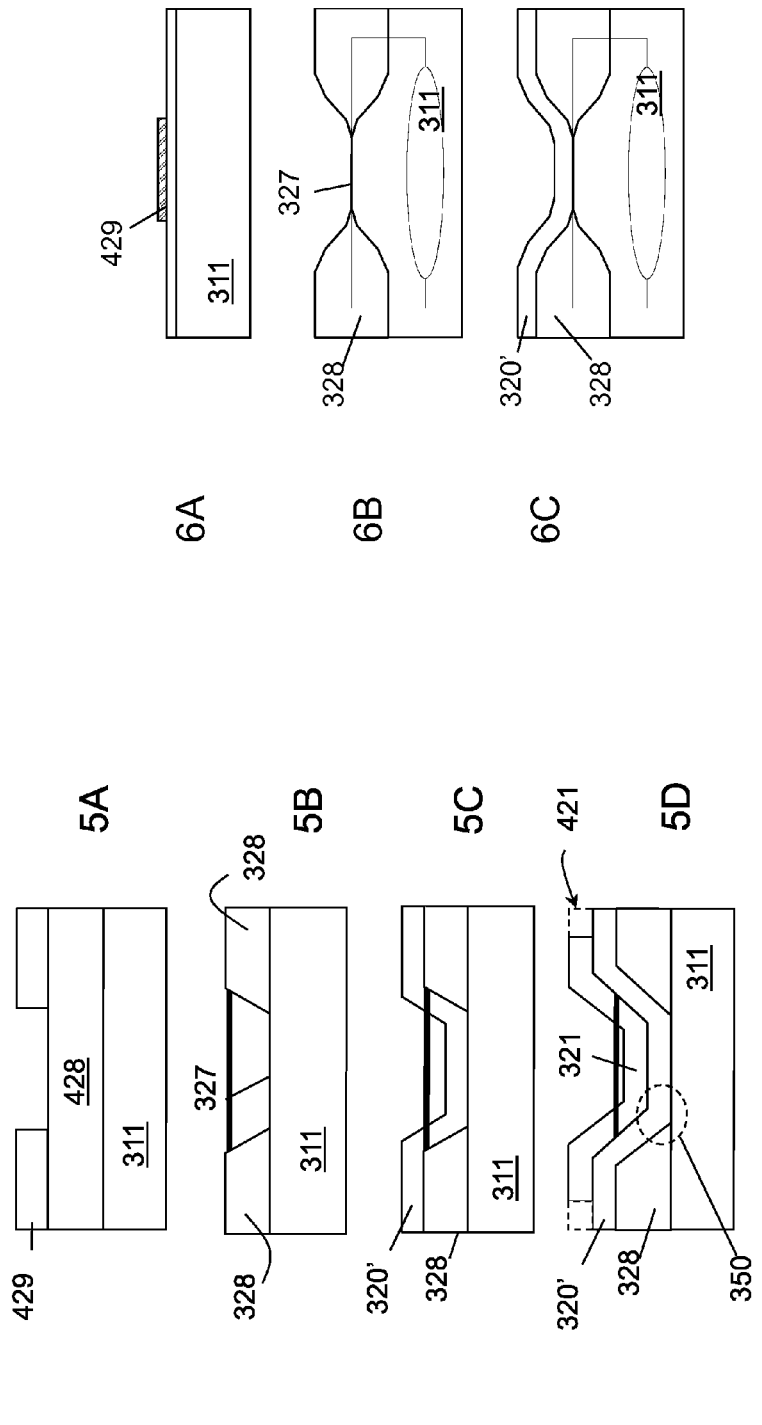

LIGHT EMITTING DEVICE STRUCTURE AND PROCESS FOR FABRICATION THEREOF

CROSS-REFERENCE TO RELATED APPLICATIONS

This application is a continuation-in-part of U.S. patent application Ser. No. 12/015,285, filed Jan. 16, 2008, now U.S. Pat. No. 7,888,686 entitled "Pixel Structure for a Solid-State Light Emitting Device"; which is a continuation-in-part of U.S. patent application Ser. No. 11/642,813, filed Dec. 21, 2006, now U.S. Pat. No. 7,800,117 entitled "Pixel Structure for a Solid State Light Emitting Device"; which claims priority from U.S. Patent Application No. 60/754,185, filed Dec. 28, 2005, which are all incorporated herein by reference.

TECHNICAL FIELD

The present invention relates to light emitting semiconductor devices, and in particular to electroluminescent light emitting device structures, and processes for fabrication thereof, for applications such as high brightness light emitters for solid-state lighting.

BACKGROUND ART

The next generation of solid-state lighting is seeking to provide advances in brightness, efficiency, colour, purity, packaging, scalability, reliability and reduced costs. The creation of light emitting devices from silicon based materials, upon which the modern electronic industry is built, has been the subject of intensive research and development around the world. To overcome the inherent low efficiency of light emission from indirect bandgap materials, such as bulk silicon and other group IV semiconductor materials, extensive research has been directed to nanostructures, i.e. nano dots, nanocrystals and superlattice structures, and materials comprising silicon nanocrystals and/or other luminescent centres, such as rare earth ions, in a suitable host matrix.

With reference to FIG. 1, a simple electroluminescent light emitting device 1 comprises a conductive substrate 2 which acts as a first electrode, e.g. an N+ silicon substrate, on which an active layer 3, i.e. light emitting layer, of a suitable thickness is deposited. The active layer comprises luminescent centers, which may be electrically excited, e.g. rare earth oxides and/or nano-particles in a host matrix such as silicon dioxide. A second electrode is deposited on the active layer, preferably a transparent conducting oxide (TCO) layer, typically indium tin oxide (ITO), to allow for light extraction from the active layer. Subsequently, a metallization step provides ohmic electrical contacts 5 and 6 to the first electrode (substrate) 2 and the second electrode (TCO) layer 4, respectively, to provide for application of an electric field and injection of electric current into the active layer 3 for excitation of light emission. At low electric fields there is no current flow and the structure behaves as a capacitor. With the application of an electric field above a characteristic threshold field, electrons can be injected into the active layer 3 from either the N+ substrate 2, via contact 6, or the ITO electrode 4, via contact 5, depending on the direction of bias. In the ballistic regime, electrons gain energy from the electric field in proportion to the distance traveled, and electrons may gain sufficient energy to excite luminescent centres, e.g. by impact ionization or impact excitation. Nevertheless, a simple device structure of this type, with a single relatively thick active layer, e.g. 150 nm, tends to have poor luminous efficacy, low excitation efficiency and low brightness.

Related co-pending applications, now published as U.S. Patent Publications Nos. 2007/0181898, entitled "Pixel Structure for a Solid-State Light Emitting Device"; 2008/0093608, entitled "Engineered Structure for Solid-State Light Emitters"; and 2008/0246046, entitled "Pixel Structure for a Solid-State Light Emitting Device" disclose emitter layer structures and methods for fabricating light emitting devices using active (light emitting) layers comprising luminescent centres in a host matrix material comprising a wide bandgap semiconductor or dielectric material, and respective drift layers adjacent each active layer, comprising a dielectric or wide bandgap semiconductor material. For example, active layers may comprise rare earth oxides or rare earth luminescent centres in a dielectric host matrix material such as silicon dioxide or silicon nitride, which may be electrically excited to produce visible light emission. For efficient excitation, corresponding drift layers adjacent each active layer have a thickness, relative to an applied electric field, dependent on a respective excitation energy of an adjacent active layer. Further examples of suitable materials for active layers and drift layers in such a structure are disclosed in related co-pending U.S. Patent Application Publication no. 20100032687, entitled "Engineered Structure for High Brightness Solid-State Light Emitters. Beneficially, emitter layer structures may comprise multiple thin active layers, which may emit different wavelengths that are combined to provide light emission of a desired colour or CRI (colour rendering index). Preferably, in deposition of the emitter layer structure, careful control of the thickness of active layers and drift layers, and in particular control of the thickness of each drift layer, dependent on the operational electric field and required excitation energies of respective adjacent active layers, provides for improved excitation efficiency.

For applications requiring high brightness, e.g. solid-state lighting, this multilayer engineered light emitting device structure offers advantages in terms of efficiency, brightness, colour control and lifetime compared with a conventional thin film electroluminescent device (TFEL). Furthermore, these structures may be fabricated using materials based on or compatible with silicon or other Group IV semiconductors.

On the other hand, whether an emitter layer structure comprises a single active layer 3 as shown in FIG. 1, or a multilayer engineered light emitting structure as described in the above referenced copending applications, another drawback of a simple light emitting structure such as shown in FIG. 1, is that under the high electric fields needed for operation, planar breakdown of the active layer 3 at the edge of the light emitting device 1 will dominate and limit the electric field that can be applied. In particular, as discussed in the above-mentioned copending applications, propagation breakdown may occur in large area emitter structures, and a high internal electric field in the vicinity of the contact interfaces with the active layer 3, may lead to an early breakdown and destruction of the light emitting device 1.

Therefore, further improvements in structures and processes for fabrication of solid-state light emitting devices are desirable, particularly for applications requiring higher brightness, luminous efficacy, and improved reliability, such as solid-state lighting.

An object of the present invention is to provide improved device structures and processes.

SUMMARY OF INVENTION

One aspect of the present invention, as disclosed in the parent application, seeks to provide improved light emitting device structures, for example, to reduce issues such as edge breakdown and propagation breakdown. Accordingly, an electroluminescent light emitting device is provided wherein the emitter layer structure comprises one or more device wells defined by thick field oxide regions, and contacts and interconnects are provided over the thick field oxide regions. Thus, device wells are laterally isolated, current injection is effectively confined to the device wells, and placement of contacts over the field oxide, adjacent the device well, reduces electric field crowding which may lead to edge breakdown. Tapering of the thickness of the field oxide provides for gradual reduction of the vertical electric field in the region between the contacts and edges of the device well.

On the other hand, field oxide regions are typically much thicker than the emitter layer structure. For multi layered engineered emitter structures, where careful control of layer thicknesses and layer to layer uniformity is required, the underlying highly non-planar topography created by the thick field oxide regions defined on the substrate, results in discontinuities, or kinks, in the emitter layer structure near edges of the device well.

Thus, a second aspect of the invention seeks to reduce problems caused by the underlying topography when field oxide regions are provided on the substrate underlying the emitter layer structure. Accordingly, a light emitting device structure is provided that comprises a light emitting structure with improved layer to layer uniformity, preferably provided on a smooth or substantially flat substrate, and comprising thick field dielectric regions overlying the emitter layer structure to define one or more device wells of the emitter layer structure.

More particularly, these aspects of present invention provide an electroluminescent light emitting device comprising: a substrate; an emitter layer structure comprising at least one active layer containing luminescent centres for light emission at a characteristic wavelength; field dielectric regions defining a device well of the emitter layer structure; and electrodes for applying an electric field to the emitter layer structure within the device well region for excitation of light emission, one of said electrodes extending from the device well over the field dielectric regions adjacent the device well, and an electrical contact to said electrode overlying said field oxide region.

Another aspect of the present invention provides a method of fabricating an electroluminescent light emitting device comprising: providing a substrate; providing an emitter layer structure comprising at least one active layer containing luminescent centres for emitting light of a characteristic wavelength; providing field dielectric regions defining a device well of the emitter layer structure; providing electrodes for applying an electric field to the emitter layer structure within the device well region, for excitation of light emission, one of said electrodes extending from the device well over a field dielectric region adjacent the device well, and providing an electrical contact to said electrode over the field oxide region.

Thus, advantageously, a large area emitter layer structure may be divided into one or more device well regions laterally isolated by thick field dielectric regions. For example, device wells may be defined on the substrate by field dielectric regions, typically field oxide regions, e.g. using a LOCOS (local oxidation of silicon) type process, or deposition of a field oxide layer and subsequent patterning and etching to open device wells. Then subsequently, a multilayer light emitting structure is deposited, e.g. a multilayer stack comprising one or more active layer/drift layer pairs. Preferably, all electrical contacts to the top electrode and interconnects are placed over the field oxide regions, which helps to reduce high field regions at edges of the emitter layer structure within the device well and current injection is thereby confined to device well regions between the field oxide regions. By dividing the area into device well regions or pixels, higher efficiency may be achieved, and deleterious effects such as propagating breakdown may also be reduced. The device well regions may be patterned for large area emitters, or alternatively, a pixellated device structure comprising a plurality of small device well regions or pixels may be fabricated.

The field oxide layers are relatively thick compared with layers of the emitter layer structure. For example, the field oxide may be 2 to 10 times the thickness of the emitter layer structure. Although this helps to reduce device capacitance, the multilayer emitter layer structure is deposited on the surface topography created by the field oxide and device well regions. The emitter layer structure may be particularly sensitive to non-uniformities or discontinuities. One problem with forming the emitter layer structure over the topography created by the field oxide layer after defining the device wells is that non-uniformities or variations in the emitter layer thickness may occur, particularly over non-planar portions of the underlying layers near edges of devices wells. These non-uniformities have potential to reduce device reliability and lifetime. Since a device of this structure operates under relatively high electric fields, discontinuities caused by the underlying layer topography, such as near the boundary of the field oxide and the substrate, may adversely affect the electric field, or create high field regions. In a preferred emitter layer structure comprising many relatively thin layers, where a drift layer thickness is desirably matched to an excitation energy of an adjacent active layer, non-uniformities and thickness variations of the active and drift layers may adversely affect excitation efficiency.

Thus, instead of a device structure comprising field oxide regions defining one or more device wells on the substrate underlying active layer structures, in preferred embodiments, the emitter layer structure is provided on the substrate and then a thick dielectric layer is deposited over the emitter layer structure and patterned to provide field dielectric regions overlying the active layer structure to define one or more device well regions. More preferably, the emitter layer structure is provided on a substantially planar substrate, and sidewalls of the thick dielectric regions are tapered to define one or more device wells of the underlying emitter layer structure.

The latter process flow is particularly advantageous for devices comprising a multilayer engineered light emitting structure, where careful control of layer thickness, composition and layer to layer uniformity is important.

One or more device well regions may be patterned for large area emitters, or alternatively a pixellated device structure comprising a plurality of small device well regions or pixels. By dividing the emitter layer structure into device well regions or pixels, e.g. using a grid of field oxide regions and an appropriate pattern of contacts and interconnects, a higher efficiency may be achieved, and deleterious effects such as propagating breakdown may be reduced.

In a structure fabricated with active layers comprising rare earth oxides, or rare earth doped dielectrics such as silicon dioxide, and wherein the drift layers comprise a suitable dielectric such as silicon dioxide or silicon nitride, the method may comprise depositing at least the emitter layer structure and the field oxide layer sequentially in the same deposition apparatus. Preferably, if a barrier layer is used, and any other optional layers of the emitter layer structure, such as one or more of a transition layer, reflective layer, barrier layer, stopper layer or other optional layer of the emitter layer structure are used, these layers comprise compatible materials, which may be also be deposited on the substrate using the same deposition apparatus. Thus, processing is simplified, because each of these layers may be deposited on a low topography or substantially planar substrate, with improved uniformity relative to deposition on a surface topography which is created when device wells are formed before deposition of active layers. Ideally, the field oxide layer is deposited in the same apparatus. Subsequently, the field oxide is patterned to define one or more device well regions and electrodes fabricated to provide for application of an electric field to the emitter layer structure within the device well.

Advantageously, another aspect of the invention provides a semiconductor wafer for fabricating large area light emitters, comprising: a substrate, a substantially planar emitter layer structure as described above, and a protective barrier layer formed thereon.

Conveniently, inventory of partially processed wafers for fabrication of large area light emitters may be prepared and held for later device well patterning and metallization as needed, to meet different product requirements, dependent on whether large area emitters, or a particular pixel structure or electrode contact structure is required.

Thus, device structures and methods of fabrication are provided in which the emitter layer structure may be substantially planar and device well regions are defined in a subsequent step. The resulting emitter layer structure may be substantially planar or have reduced topography relative to patterning device wells before deposition of the emitter layer structure. When the emitter layer structure comprises many relative thin layers, improved uniformity and reduced thickness variations help to provide improved reliability and/or performance. Fabrication is facilitated with increased process flexibility for subsequent processing. In large area emitter structures comprising device well regions, the active layer uniformity is improved, with corresponding improvement in device reliability, and without increasing process complexity or the number of process steps.

Embodiments of the invention will now be described by way of example only, with reference to the following drawings.

BRIEF DESCRIPTION OF THE DRAWINGS

FIG. 5 illustrates schematically steps 5A to 5E in a process flow for fabrication of part of a device structure similar to that shown in FIG. 4;

FIG. 6 illustrates schematically steps 6A to 6C in an alternative process flow for fabrication of a part of device structure similar to that shown in FIG. 4;

DETAILED DESCRIPTION OF PREFERRED EMBODIMENTS

Figure 1:
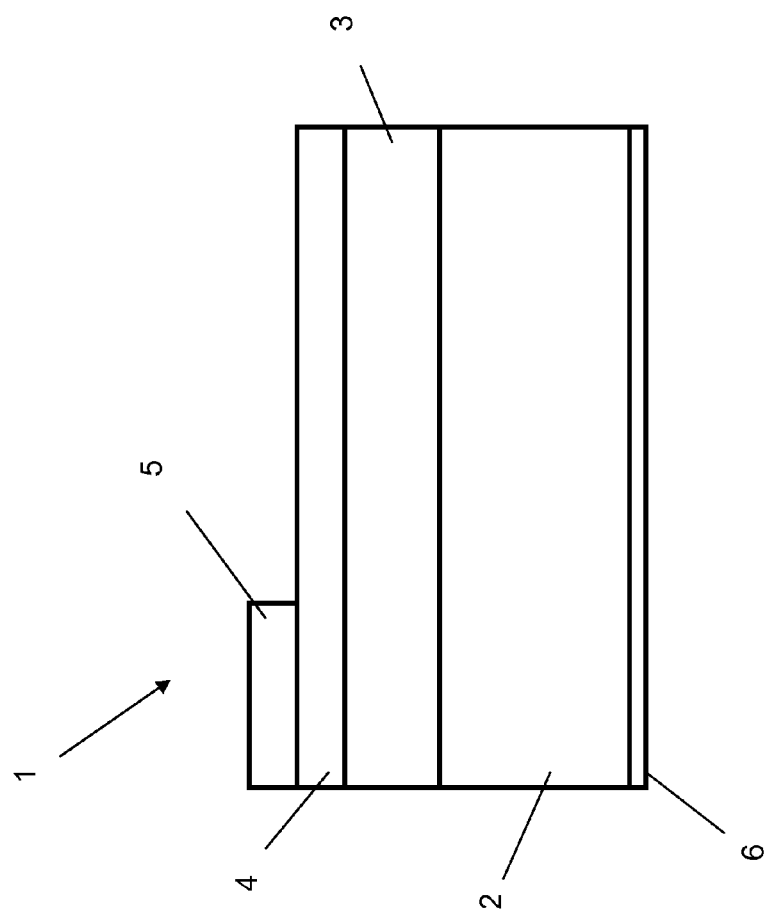
FIG. 1 shows schematically a prior art light emitting device structure.
Figure 2:
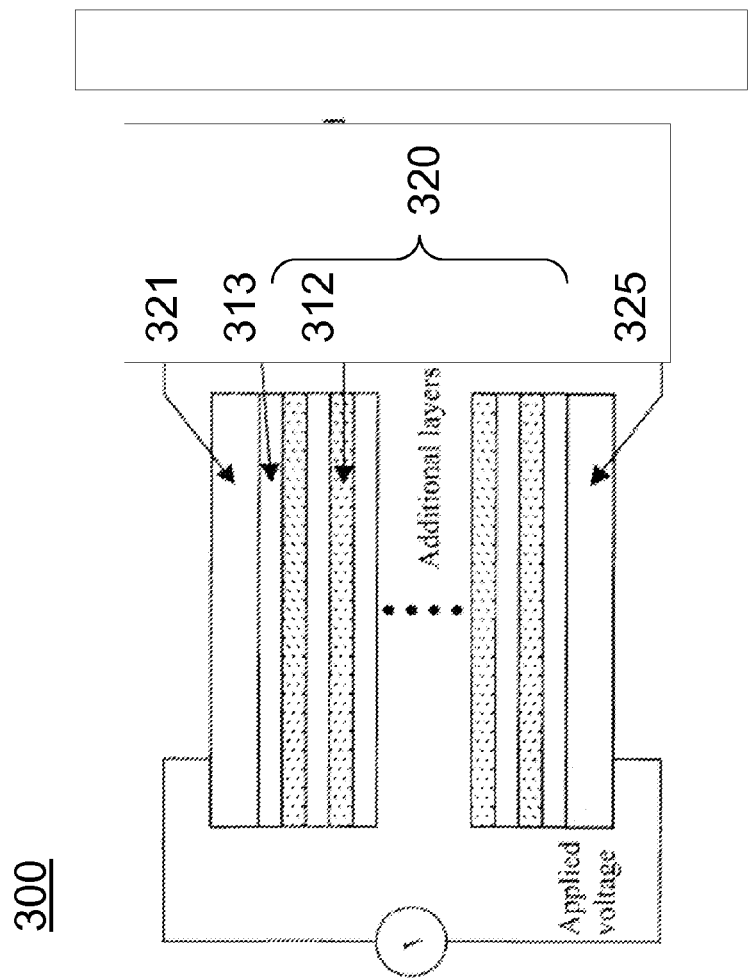
FIG. 2 shows schematically a simplified device structure embodying a multilayer emitter layer structure.

A simplified schematic of an electroluminescent (EL) device structure 300 is shown in FIG. 2, which comprises an emitter layer structure 320 comprising a plurality of emissive or active layers 312, i.e. optically active layers comprising luminescent centres that may be electrically excited, and respective drift or acceleration layers 313 (buffer layers) adjacent each active layer 312. This structure is similar to structures that are disclosed in related co-pending U.S. Patent Application Publication No. 2008/0093608, entitled "Engineered Structure for Solid-State Light Emitters". The active layers 312 may comprise rare earth luminescent centres in a host matrix, e.g. a rare earth oxide or rare earth doped silicon dioxide or silicon nitride, while drift layers 313 comprise silicon dioxide, silicon nitride or another suitable dielectric. The multilayer emitter layer structure 320 is disposed between electrodes 321 and 325, for applying an electric field to the light emitting structure for electrically exciting light emission. One electrode, usually a top electrode 321, comprises a transparent conductive oxide (TCO), typically a layer of indium tin oxide (ITO) or other suitable transparent conductive material. The latter electrode 321 not only provides for electron injection, but also allows light to be extracted from the device 320. Electrons are accelerated and gain energy from an applied electric field as they traverse each drift layer 313, and energy is released as light from excitation of luminescent centres in an adjacent active layer 312, i.e. by impact ionization or impact excitation. A device of this type may be operated with DC or AC voltage. At low electric fields, there is no current flow and the device acts as a capacitor. In operation, with application of an electric field above a characteristic threshold, typically around 4 to 5 MV/cm in a silicon dioxide based structure, electrons can be injected into the light emitting structure 320. Above the threshold voltage, a supply of electrons may be injected allowing for higher current operation than conventional capacitative electroluminescent devices, resulting in more electrons having sufficient energy for excitation of luminescent centres, and higher brightness.

In the ballistic regime, the kinetic energy in electron volts gained by an electron passing through the drift region 313 is E×d where E is the electric field across a drift layer 313 in V/nm and d is the thickness of the drift layer in nm. Thus, as described in co-pending U.S. Patent Application No, 2008/0093608, by selecting the appropriate thickness of each drift (buffer) layer 313, matched to an excitation energy of a respective active layer 312, electrons gain the necessary energy to excite the emissive layer to emit light at a desired wavelength. Careful consideration and design of the drift layer 313 thickness in conjunction with the operating electric field allows tuning of the electron energy with the drift layer thickness. The drift layers 313 may be made, e.g. from a wide bandgap semiconductor or dielectric material, such as high quality oxides or nitrides of silicon. Since the device 300 operates at relatively high electric fields, typically about 4 to 8 MV/cm (i.e. above a minimum threshold voltage for light generation and below an upper limit depending on the breakdown voltage of specific materials in the light emitting structure) high quality dielectric or wide bandgap semiconductor layers are required, with low trap density. The light emitting structure 320 may be deposited by techniques such as CVD (chemical vapour deposition), PECVD (plasma enhanced CVD), sputtering, ALE (atomic layer epitaxy) and MBE (molecular beam epitaxy), capable of depositing high quality active and drift layers 312 and 313 of in the range from 1 nm to 10 nm thickness.

For applications requiring high brightness, e.g. solid-state lighting, this type of light emitting device structure 300 offer many advantages in terms of efficiency, brightness, colour control and lifetime compared with a conventional thin film electroluminescent device (TFEL). Furthermore, these structures 300 may be fabricated using materials based on and compatible with silicon or other Group IV semiconductors.

A light emitting structure for a single colour may be provided by an engineered film structure comprising a layer stack repeating identical pairs of active layers and dielectric drift layers 312/313 as shown in FIG. 2. For mixed colours or white light, a structure may comprise active layers 312 emitting two or more colours or wavelengths, e.g. several layer pairs for each constituent colour. Thus, an emitter layer structure 320 may comprise one or more layer pairs 312/313 comprising a first active layer emitting a first wavelength or colour, and one or more layer pairs 314/315 comprising a second active layer 314 emitting a second wavelength or colour. As shown schematically in FIG. 3, an emitter layer structure 320' may comprise a plurality of first and second active layers 312 and 314 that are grouped as separate stacks, with respective drift layers 313 and 315. In other embodiments (not shown) three emitter layers stacks, for emitting respectively red, green and yellow wavelengths, may be combined in a single device to provide white light emission of a desired colour rendering index (CRI). For engineered film structures 320' such as shown in FIG. 3 to be powered by AC electrical power, in which neighboring active layers 312 and 314 emit at different wavelengths, and require different excitation energies, the intervening drift layer 313 or 315 must be thick enough to excite the luminescent centres in active layer 312 or 314 requiring the higher excitation energy.

As noted above, for electroluminescent devices 320' that work under relatively high electric fields (in the order of ~5 MV/cm or 0.5V/nm) high quality dielectrics, e.g. with low trap density, are required to obtain sufficient device lifetime. Furthermore, for operation at high fields, it is desirable to provide contact structures that reduce discontinuities and avoid localized high field regions that may lead to propagation breakdown, thereby providing better control current injection in active regions, e.g. for improved performance and device lifetime.

Figure 7:
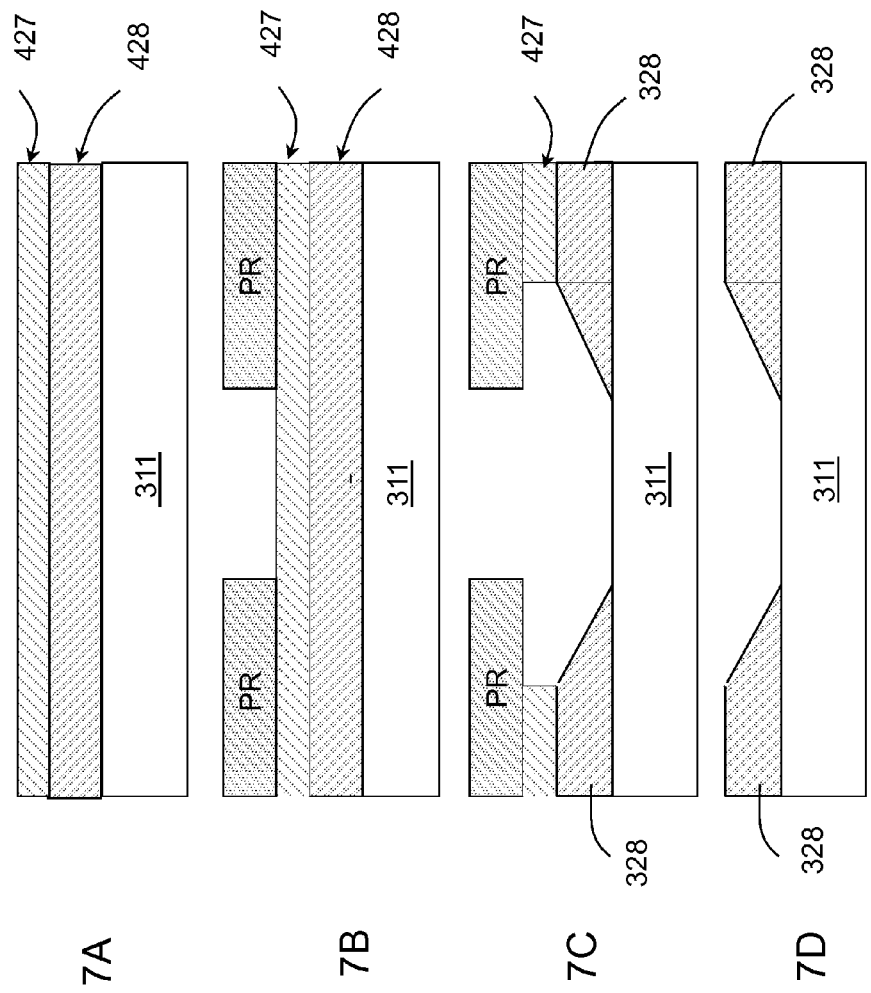
FIG. 7 illustrates schematically steps 7A to 7D in another alternative process flow for fabrication of part of device structure similar to that shown in FIG. 4.

As described in co-pending U.S. patent publication no. 2008/0246046 entitled "Pixel Structure for a Light Emitting Device", in fabrication of large area emitter structures, the active region may be divided into device well regions so that current injection is confined to the device well regions. FIG. 4 illustrates one device well of a device structure 400, which comprises an emitter layer structure 320 or 320' provided on a conductive substrate 311, e.g. n$^+$-doped silicon, which acts as a bottom electrode layer to which a backside electrical contact 325 is provided. A device well 327 is defined on the substrate 311 by field oxide regions 328, i.e. by a silicon dioxide formed by deposition of a field oxide layer and subsequent patterning and etching, or by a LOCOS type process (e.g. by process steps illustrated in FIGS. 5, 6 and 7). Subsequently, after patterning the device wells 327, the multilayer light emitting structure 320' comprising one or more layer pairs of active layers 312, 314 and respective drift layers 313, 315, e.g. as shown in FIG. 24, is deposited thereon. An additional layer 331 comprising a reflective layer, transition layer and/or other layer, may optionally be provided underlying the emitter layer structure 320' in the device well 327. The top electrode layer 321 comprising a transparent conductive oxide, such as ITO, is deposited over the emitter layer structure 320', and after depositing a protective silicon nitride cap or passivation layer 342, and top contacts of layers 322/323 are provided to the TCO layer 321. This device well structure is advantageous because electrical contacts 323 may be placed over the field oxide regions 328, and current injection is thereby confined to the device well 327 between the field oxide regions 328. The structure helps to reduce high field regions near edges 350 of the active region 320' within the device well 327. By dividing the area in to device wells 327, higher efficiency may be achieved, and deleterious effects such as propagating breakdown are also reduced. To improve the optical extraction efficiency of the device 400, an encapsulant layer of a suitable refractive index 335 may be disposed over the device well 327.

Figures 3, 4:
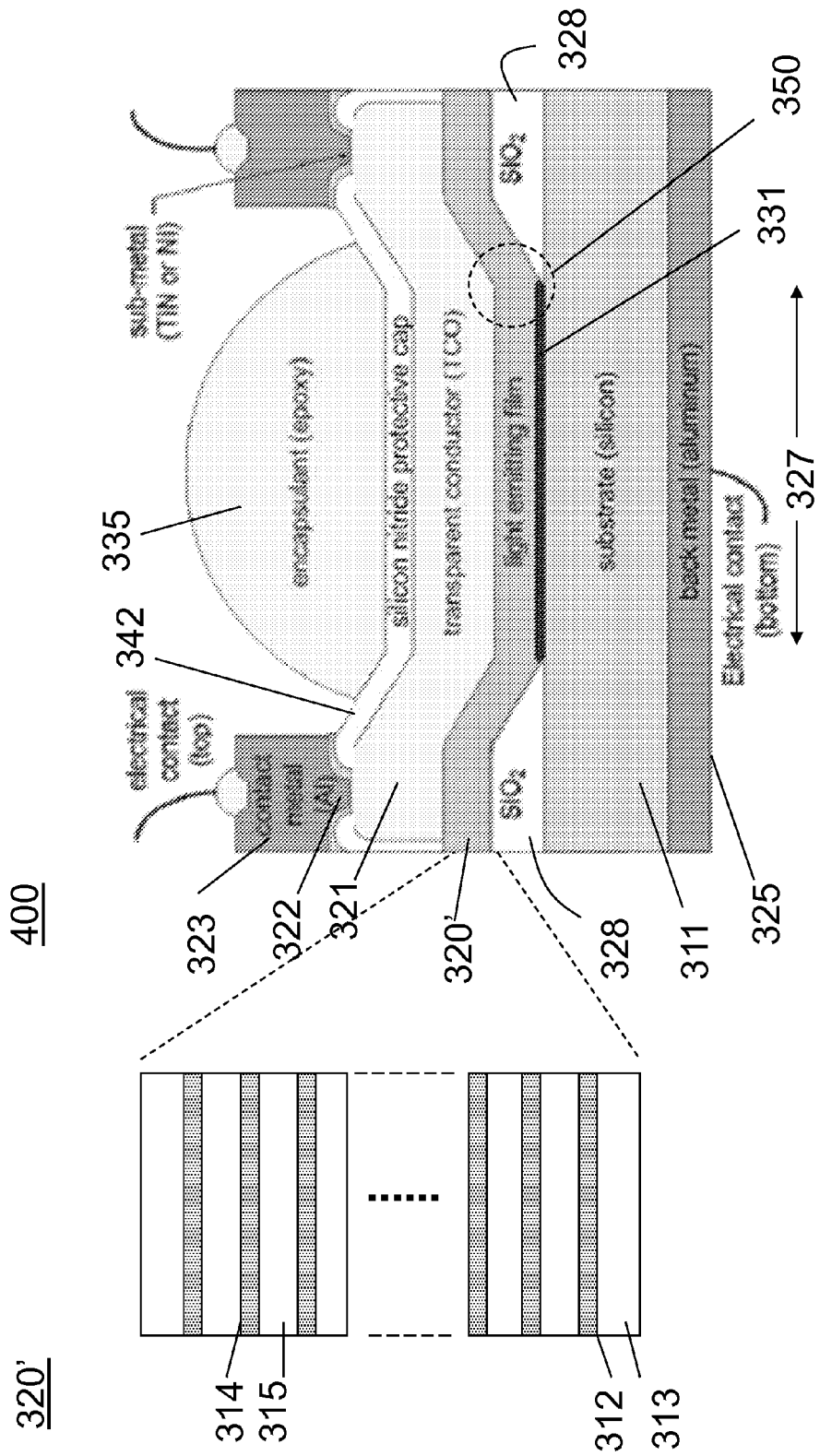
FIG. 3 shows schematically an alternative emitter layer structure.
FIG. 4 shows schematically a light emitting device structure embodying a multilayer emitter layer structure, such as shown in FIG. 3.

The layer thicknesses represented schematically in FIG. 4 are representative, but not intended to be to scale. Solely by way of example, the thickness of the emitter layer structure 320' may range from about 10 nm to about ~100 nm, or perhaps about ~1000 nm depending on the number of active/drift layer pairs. Each active layer 312 and 314 has a carefully controlled thickness in the range from around 1 nm to 10 nm thick. The field oxide layer regions 328 are relatively much thicker and may be about 500 nm to about 1000 nm. The overlying TCO electrode layer 321 may be about ~150 to about 500 nm. Providing the ohmic metal contacts 323 over the field oxide regions 328 reduces the parasitic capacitance associated with this region. Preferably the field oxide regions (FOX) 328 are 2 to 10 times as thick, and preferably 4 to 6 times as thick as the emitter layer structure 320'. Since the total capacitance is the series combination of $C_{FOX}$ and $C_{EMITTER\ LAYER}$, placement of contacts 323 over the field oxide regions 328 provides a reduction in total device capacitance and the magnitude of the measured displacement current. The thick field oxide regions 328 also effectively confine current flow within the device well regions 327. Typically, device wells 327 may be, for example, about ~5 μm to about 5000 μm wide.

In a process of fabrication of the light emitting device structure 400 shown in FIG. 4, a process flow such as shown in FIG. 5 may be used to provide field oxide regions 328 defining device wells 327. Referring to FIGS. 5A to 5E, the device structure 400 is fabricated on the conductive substrate 311, e.g. n+ type silicon substrate. A field oxide (FOX) layer 428 is grown or deposited on the substrate 311 (FIG. 5A). Thereafter, device wells 327 are patterned in the FOX layer 428 (FIG. 5B) using a conventional masking and etching process, e.g. using photoresist layer 429 to mask FOX regions 328 during etching. The emitter layer structure 320 or 320', comprising at least one active layer/drift layer pair is deposited over the field oxide layer regions 328 and extends into the device well regions 327 (FIG. 5C). That is, the active layer structure 320' conforms to the topography of the underlying device well pattern 327 in the FOX layer 428. Subsequently, a top electrode layer 421, comprising a transparent conductive oxide material (TCO) is deposited on top of the emitter layer structure 320, and patterned as required to provide the top transparent electrode 321 (FIG. 5D). Overlying the TCO electrode structure 321, preferably, a dielectric layer 442, i.e. the passivating layer or protective cap layer 342, is provided, typically of silicon nitride (FIG. 5E). Top and bottom contacts 323 and 325 are then provided by a known process to provide the structure shown in FIG. 25. That is, after opening contact holes 444 in the passivation layer 442, the top contact 323 is provide to the TCO layer 321, comprising suitable metallization, such as aluminum (FIG. 4). As is conventional, a contact barrier layer 322, such as a layer of titanium nitride (TiN) or nickel (Ni) may be provided on the TCO electrode layer 321 before deposition of contact metallization 323, thereon, over the field oxide region 328. Also, in this embodiment, since the substrate 311 is conductive, a backside electrical contact 325 is provided to the substrate 311. The top and bottom contacts 321 and 325 respectively, provide for applying an AC or DC electric field for electrical excitation of luminescent species in the emitter layer structure 320'.

If required, the reflector layer 331 may be provided under the emitter layer structure 320 to enhance light extraction. Additional or alternative layer structures 331 may be provided, if required above and/or below the emitter layer structure 320'. These layer structures 331 may comprise transition layers having a higher conductivity than adjacent layers of the emitter layer structure to reduce the electric field at the interface between the electrodes and the emitter layer structure as described in the related co-pending applications. A transition layer may, for example, comprise silicon rich silicon oxide (SRSO). Such layers potentially reduce the electric field required to generate the appropriate current flow. Layer structures 331 may additionally or alternatively comprise barrier layers between the emitter layer structure 320' and the electrode structures 321 and 311, as described in co-pending applications.

When the substrate 311 is silicon, the field oxide regions 328 may be thermal oxide regions, such as formed by a conventional LOCOS process, e.g. as illustrated schematically in steps 6A to 6C. In the first step (FIG. 6A) a mask 429 is patterned on the substrate 311 in the device well region 327. Subsequently, (FIG. 27B), thermal oxidation of the unmasked areas of the substrate 311 is conducted forming the field oxide regions 328 with the device well region 327 therebetween. Then the emitter layer structure 320 or 320' is deposited over the field oxide regions 328 and in the device well region 327 (FIG. 6C). The remaining steps are similar to those described above with reference to FIG. 5.

Referring to FIG. 4, tapering the sidewall of the field oxide regions 328 defining the device well regions 327 provides for a gradual reduction of vertical electric field from the contact area below contacts 323 to the device well region 328. However, since the multilayer active layer structure 320 or 320' is deposited on the surface topography created by the field oxide and device well regions 328 and 327, some non-uniformities or variation in film thickness of the non-planar emitter layer structure 320 or 320' tend to occur, particularly near the edges 350 of device well regions 327, where the field oxide meets the underlying substrate 311. Since the emitter layer structure 320' may be particularly sensitive to non-uniformities or discontinuities, one problem with forming the emitter layer structure 320' over the topography created by the relatively thick field oxide layer 328 after defining the device wells 327 is that non-uniformities or variations in the emitter layer thickness may occur on non-planar portions. Non-uniformities will be more apparent at discontinuities, e.g. regions 350, near edges of device wells 327. Moreover, since a device of this structure operates under relatively high electric fields, discontinuities caused by the underlying layer topography, such as near the boundary of the field oxide regions 328 and the substrate 311, may adversely affect the electric field, or create high field regions. These non-uniformities in the active layer structure 320' have potential to reduce device reliability and lifetime. Also, since the preferred emitter layer structure 320' comprises many relatively thin layers, and for efficiency, the drift layer thickness is desirably matched to an excitation energy of an adjacent active layer 312 or 324, a multilayer emitter structure 320' of this composition is sensitive to non-uniformities and thickness variations of both the active and drift layers 312/314 and 313/315.

One way to reduce the surface topography is to use a process for patterning the field oxide layer regions 328 so as to provide a low angle taper in the field oxide, i.e. sidewall tapering with a more gradual transition as shown in FIG. 7A to 7D. This may be achieved for example by depositing a field oxide layer 428, followed by a layer 427 of another dielectric or oxide which etches at a different rate from layer 428, i.e. faster than the underlying layer 428. By using dielectric layers of various thicknesses and etch properties and an appropriate differential etch process, it is possible to control the taper angle of the sidewall of the field oxide region around the device well 327, and thus reduces the surface topography around the device well regions 327. For example, a thermal field oxide layer 428, e.g. ~500 nm to 1000 nm thick, may be covered by a thinner layer 427, e.g. 100 nm of LPCVD silicon dioxide, doped oxide, spin on glass or damaged oxides (e.g. plasma damaged) having a higher etch rate than the underlying layer 428 (FIG. 28B). After patterning a photoresist layer (PR) on top of the thinner layer 427, any process by which the etch rate of layer 427 is increased relative to the underlying field oxide layer 427 may be used (FIG. 7C). Etching in an isotropic wet etch, typically buffered hydrofluoric acid, or dry etching is then used to provide low-angle tapered field oxide regions 328 as shown in FIG. 7D. Nevertheless, such a process requires more process steps, which increases process complexity, and provides limited improvement since the emitter layer structure 320' must still be deposited over the relatively thick field oxide layer regions 328.

To avoid these non-uniformities in the active layer structure 320 caused by the underlying surface topography, an alternative or improved device structure, and process for its fabrication, is therefore required.

Figure 8:
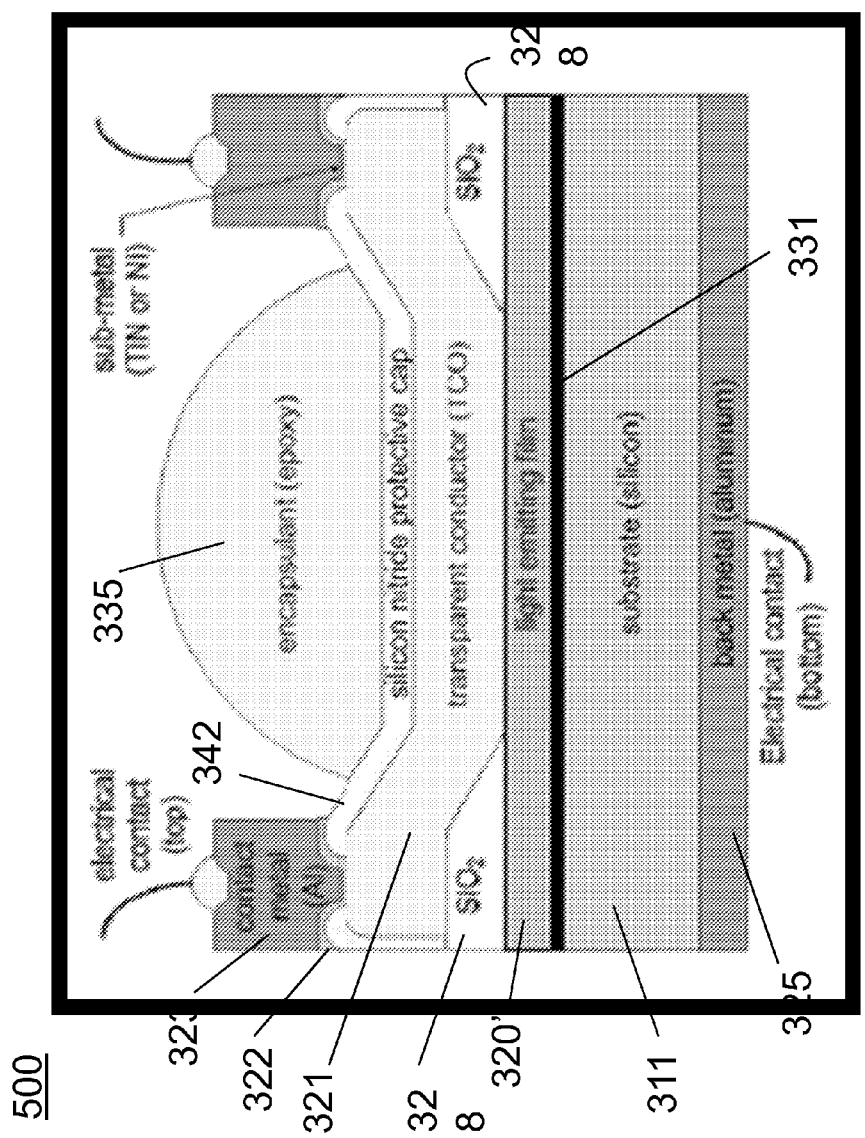
FIG. 8 shows schematically a device structure according to a first embodiment of the present invention.

A device structure 500 according to another aspect of the present invention is shown in FIG. 8. To provide a substantially planar active layer structure 320 or 320', an alternative process flow according to a preferred embodiment of this aspect of present invention is provided as shown in FIGS. 10A to 10F. In this embodiment, the light emitting device structure 500 comprises a substantially planar conductive substrate 311, e.g. n$^+$-doped silicon. However, this structure differs from that shown in FIG. 4 in that the emitter layer structure 320' is provided on the substrate 311 before patterning of the device wells 327. Then an overlying relatively thick dielectric layer 428, i.e. a field oxide layer, is provided, and subsequently device well regions 327 are patterned in the field oxide layer 428 by selectively removing parts of the field oxide layer to leave field oxide regions 328 defining tapered sidewalls around the device well 327 of the emitter layer structure. As shown in FIG. 8, the first electrode 325 is provided on the back side of the device structure 500, and the second electrode, i.e. top electrode 321, comprising a TCO layer, extends over the field dielectric regions 328 and contacts the emitter layer structure 320 within the device well region 327. Electrical contacts 323 are provided to the second electrode layer 321 in regions overlying the field oxide regions 328, and away from the device well region 327, for applying an electric field for energizing the device, similar to those shown in FIG. 4.

A dielectric layer, i.e. the passivating layer or protective cap layer 342, is provided over the TCO electrode layer 321, typically of silicon nitride (FIG. 5E). As is conventional, the contact barrier layer 322, such as a layer of titanium nitride (TiN) or nickel (Ni) may be provided on the TCO electrode layer 321 before deposition of contact metallization 323, thereon, over the field oxide region 328. To improve the extraction efficiency of the device 500, an encapsulant layer 335 of a suitably matched refractive index is disposed over the device well 327.

This structure has the advantage that the emitter layer structure 320 or 320' is substantially planar since it is deposited on the substantially planar surface of the substrate 311 before deposition and patterning of the field oxide regions defining the device wells 327. This is beneficial because the emitter layer structure 320 or 320' is more sensitive to discontinuities and non-uniformities caused by underlying topography, particularly when the emitter layer structure 320 or 320' is formed from multiple thin layers having specific, controlled thicknesses as described above. At the same time, the field oxide regions 328 overlying the emitter layer structure 320 or 320' and the placement of the contacts 323 over the field oxide regions 328 provide similar advantages as described above, confining current injection to the device well region, reducing high field regions associated with contacts, and reducing device capacitance. The relatively thick overlying contact layer 321, such as the TCO layer, may be more tolerant to discontinuities in underlying topography at edges 350 of the device well 327.

Figure 9:
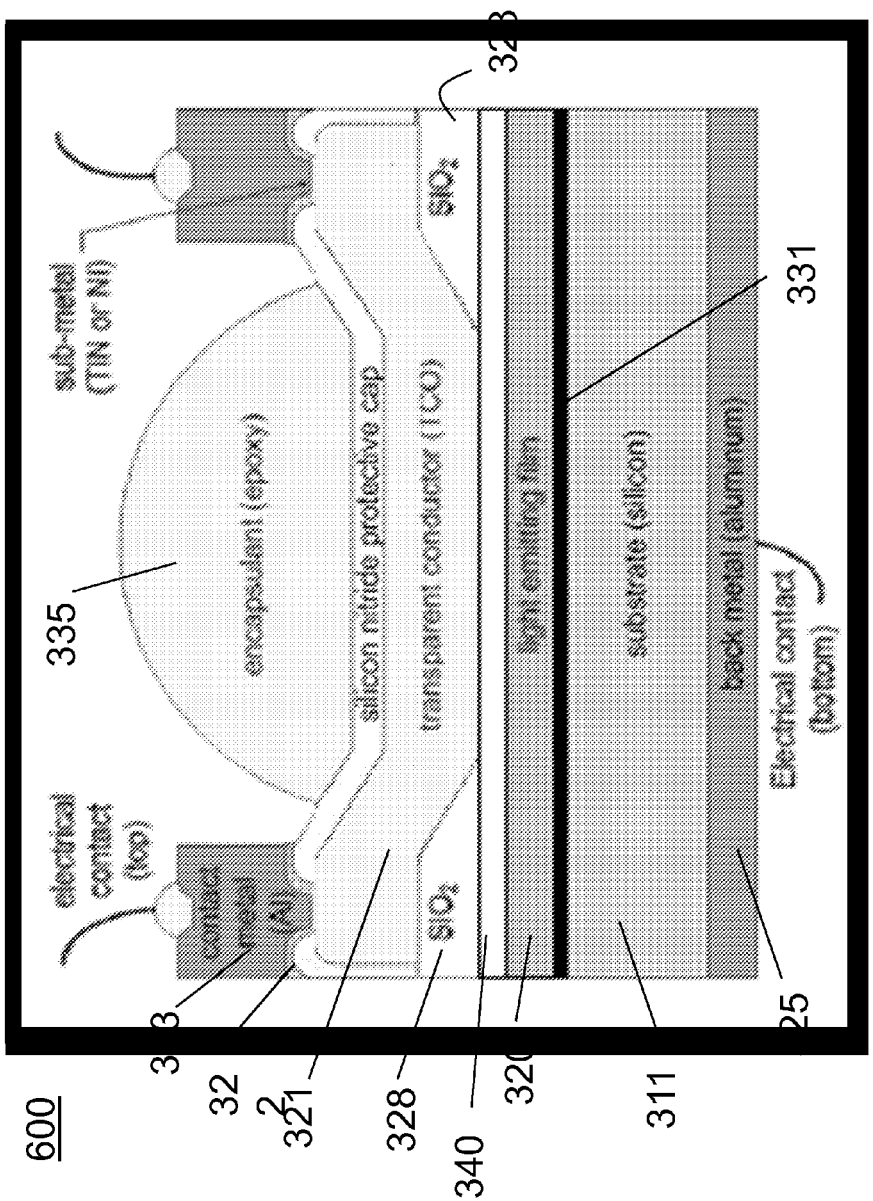
FIG. 9 shows schematically a device structure according to a second embodiment of the invention.

The device structure 600 shown in FIG. 9 is similar to that shown in FIG. 29, except that additionally, a barrier layer 340 is provided overlying the emitter layer structure 320'. Advantageously, the barrier layer 340 comprises a layer of silicon nitride, or other suitable material, which provides one or more of several functions. Preferably, the barrier layer 340 comprises a material which acts as an etch stop during patterning of the overlying field oxide layer 328 to define device wells 327, and also provides a seal or protective layer during subsequent processing. Beneficially, the barrier layer 340 may also provide another function, for example a layer of silicon nitride of about 20 nm to 50 nm acts as a hot electron stopper layer (coolant layer), which, in operation of the device structure 600 as an electroluminescent light-emitting structure, protects the top electrode layer 321 from deleterious hot electron effects, as described in U.S. Patent Application No. 2009/0128029, entitled "A Light Emitting Device with a Stopper Layer Structure", filed Nov. 19, 2008.

Steps in a process flow for a method of fabricating the device structures, according to first and second embodiments, are illustrated in FIGS. 10A to 10G. The planar substrate 311 is provided, e.g. a heavily n doped silicon substrate wafer. Optionally, a layer 331, which may comprise a transition layer, back reflector layer and/or a conductive contact layer, is deposited on the substrate 311. The light emitting structure 320 or 320', comprising a plurality of active layer and drift layer pairs, as described above, is then deposited thereon.

The emitter layer structure 320 or 320' may comprise one or more layer pairs, each comprising an active layer and a respective drift layer comprising a dielectric or wide bandgap semiconductor. When the emitter layer structure 320 or 320' comprises a multiplicity of layer pairs, e.g. 25 or 50 layer pairs, each active layer being ~1 nm to ~10 nm thick, since most modern deposition tools are very good at depositing uniform films on blanket wafers, deposition of the active emitter layer structure 320' on the planar substrate 311 allows for multilayer structures with improved uniformity relative to deposition on a surface having a topography which is created when device wells are formed before deposition of active layers.

Figure 10:
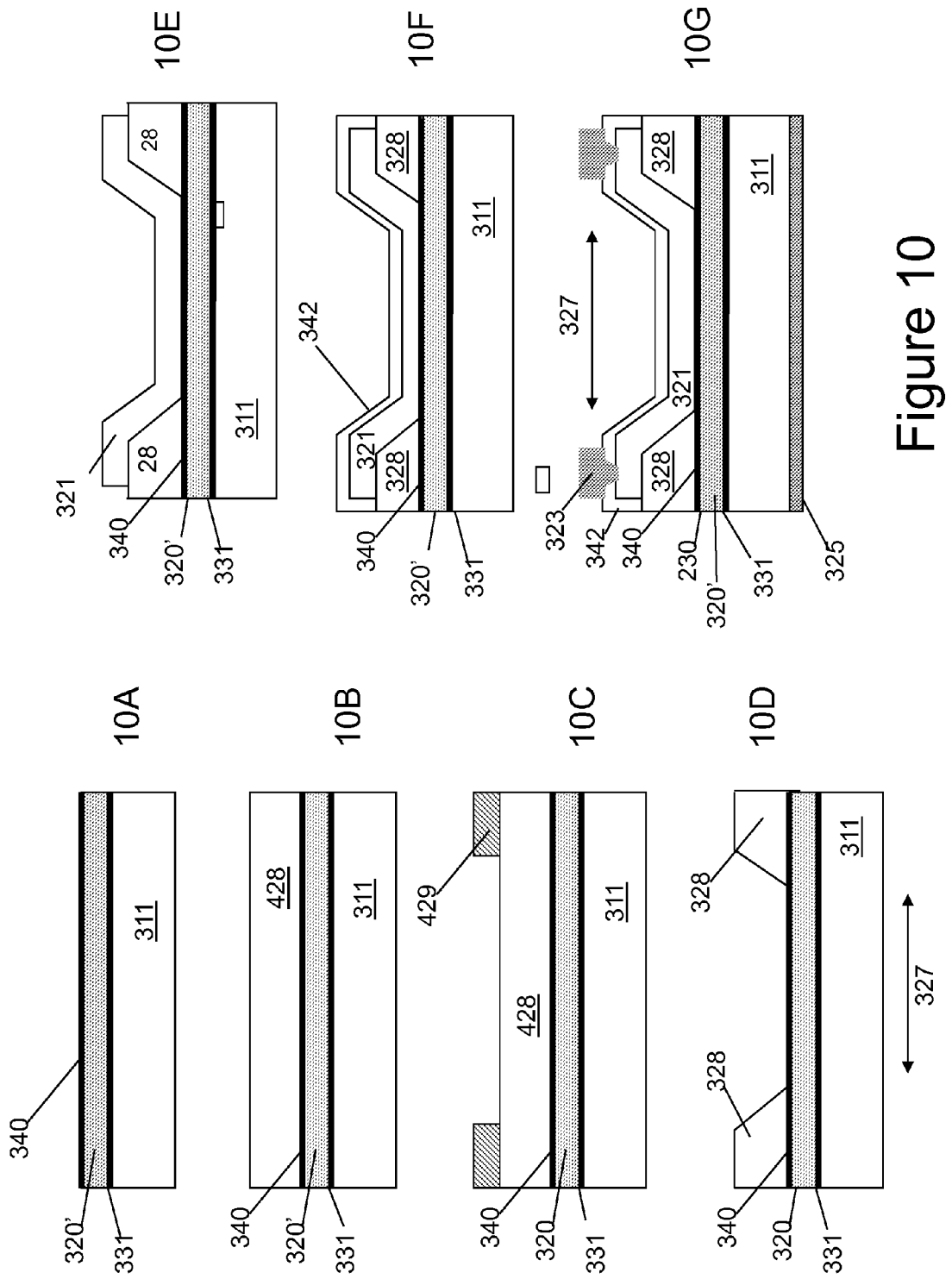
FIG. 10 illustrates schematically steps 10A to 10G in a process flow for fabrication of a device structure according to the second embodiment of the present invention.

If used, a barrier layer 340 comprising one or more layers is deposited over the emitter layer structure 320 (FIG. 10A).

Then, a field oxide layer 428 is deposited (FIG. 10B). The field oxide layer 428 is patterned using a mask 429 to open up one or more device well regions 327 over the emitter layer structure 320', by a known masking and etching process (FIG. 10C). Preferably, when the field oxide is silicon dioxide, the barrier layer 340 comprises a layer of silicon nitride to provide an etch stop for patterning of the field oxide to form the device well regions 327 separated by field oxide regions 328 (FIG. 10D).

The conductive electrode layer 321 comprising a transparent conductive oxide, e.g. TCO is then deposited to provide a contact to the emitter layer structure 320 or 320', through layers 340 and/or 332 if used, within the device well regions 327 (FIG. 10E). The protective silicon nitride cap 342 is then deposited (FIG. 10E). After opening up contact holes in the protective cap layer 342, the electrical contacts 322 comprising a barrier layer, such as TiN, and contact metal, e.g. aluminum layer, are then deposited and patterned, as is conventional, to provide top electrical contacts 323. A backside contact layer 325, e.g. deposited aluminum, is then provided to the substrate 311 (FIG. 10G).

When the substrate 311 is conductive, e.g. n+ doped silicon, a back electrical contact 325 may be provided to the bottom side of the substrate 311, and a top electrical contact 323 is provided to the electrode layer 321 overlying the field oxide regions 328. Alternatively, in variants of the above described structure, if the substrate 311 is non-conductive, a suitable bottom electrical contact layer 331 may be provided on the top side of the substrate 311 underlying the active layer structure 320. The top electrode layer 321 is preferably ITO, or other transparent conductive oxide (TCO) to allow for light extraction from the device well region 327.

When a barrier layer 340 is provided as shown in FIG. 9 or 10A, conveniently, an inventory of wafers for fabrication of large area light emitters may be prepared with a protective barrier layer 340, and held for later device well patterning and metallization as needed, depending on the particular pixel structure or electrode contact structure required. A nitride barrier layer 340 and/or thicker field dielectric such as a field oxide protects the underlying structure 320 or 320' until further processing. The latter may be readily cleaned by conventional RCA clean/HF dip, or etch prior to patterning of the device wells 327 and subsequent contact structure 323 formation.

Thus, device structures and methods of fabrication are provided in which the emitter layer structure 320 or 320' is substantially planar and device well regions 327 are defined in a subsequent step. This process flow avoids or reduces non-uniformities that result from formation of emitter layer structures 320 or 320' on non-planar surface topography resulting from field oxide regions 328 when device wells 327 are formed before emitter layer 320 or 320' deposition. Formation of pixel structures is facilitated. For large area emitter structures, which are divided into device well regions 327, the uniformity of the active emitter layer structure 320 or 320' is improved, with corresponding improvement in device reliability, without increasing process complexity or the number of process steps. The process flow provides flexibility to defer patterning of device wells and subsequent metallization, until after deposition of the field oxide layer, at which time, any required device well or pixel structure may be patterned, for example As described in related copending applications, in preferred embodiments, the active light emitting layer structure 320 comprises one or more layer pairs, each comprising an active layer 312 and a respective adjacent drift layer 313. Preferably, the active layers 312 comprise rare earth luminescent centres in a suitable host matrix, e.g. a rare earth oxide, or rare earth doped dielectric such as rare earth doped silicon dioxide, silicon nitride or silicon oxynitride. For energy matching of the electron energy to the excitation energy of an active layer 312, ideally, the active layers are preferably as thin as possible, but in practice may be about ~1 nm to ~10 nm thick. For example, to provide sufficient thickness to incorporate enough rare earth luminescent centres to emit sufficient light of a suitable intensity, and to be thin enough to provide effective energy matching, the active layers 312 are preferably about ~4 nm thick. The drift layers 313 may comprise undoped silicon dioxide, or other suitable dielectric of an appropriate thickness. Silicon dioxide is preferred over silicon nitride, which has a higher trap density. The thickness of each drift layer 313 is controlled to provide the appropriate excitation energy for a respective adjacent drift layer 313, and thus, it will be dependent on the excitation energy of the respective active layer 312 and the electric field to be used for operation of the device 400, 500 or 600, and will typically be from about ~3 nm to about ~10 nm for a device 400, 500 or 600 operating at 5 MV/cm, or more, to produce sufficient energy for excitation of visible wavelengths (~1.6 eV to ~3 eV or wavelengths from about 700 nm to 380 nm). The emitter layer structure 320 or 320' may comprise layers for emitting different wavelengths, i.e. silicon dioxide doped with different rare earth luminescent centres, and during deposition, the thickness of each drift layer 313, in a direction of the electric field, is matched in proportion to the excitation energy required for the adjacent active layers 312. Active layers 314 emitting different wavelengths or colours may be provided, e.g. by doping with different rare earth species, and combined in an emitter layer structure 320' with respective drift layers 315 of appropriate thicknesses as illustrated, for example, in FIG. 24.

By way of example, for an electric field E of 5 MV/cm or 0.5V/nm, and a desired electron excitation energy of 2.3 eV, the thickness t of the buffer layer 313 or 315 is given by the desired excitation energy e divided by the electric field E, i.e. (2.3 eV)/(0.5V/nm)=4.6 nm. Typically, the required excitation energy is characteristic of the active layer material, i.e. the specific rare earth luminescent species and its emission wavelength, and/or the host material, and is related to the photon energy hv for the wavelength of emission of the active layer 312 or 314; (typically excitation energy≧hv, e.g. depending on optical characteristics of the active layer 312 or 314). For example, for a 5 MV/cm field, excitation energies and drift layer thicknesses may be ~1.9 eV for red photons (t=3.8 nm), ~2.3 eV for green photons (t=4.6 nm), or ~2.8 eV for blue photons (t=5.6 nm). Typically, for active layers 312 and 314 having different luminescent centres producing light of different wavelengths and requiring different excitation energies, the thickness of the drift layers 313 and 315 needed for excitation of each respective active layer 312 or 314 would be determined accordingly (i.e. in ratio of the required excitation energies, and depending on the electric field), and may be different for each active layer 312 or 314 emitting light of a different colour or wavelength and requiring a different excitation energy. If active layers 312 and 314 (FIG. 23) all emit light of the same colour or wavelength (i.e. wavelength range), and require the same excitation energy, drift layers 313 and 315 will have the same thickness. Structures may be provided with only one active layer, or a plurality of active layers 312 and 314, e.g. up to 50 layers or more, each with a respective drift layer 313 or 315 for a total thickness ranging from about ~10 nm for one active and one drift layer 313, to about ~100 nm to 300 nm or up to 1000 nm or more depending on the number of layer pairs in multilayer structures 320' and available operating voltage to achieve appropriate electric fields in the emitter layer structure 320'. Typically, operating voltages will provide for electric fields in the range of 4-10 MV/cm to be applied to the active layers 312/314 and drift layers 313/315, depending on the materials selected for each layer.

A single colour can be emitted by an engineered film structure 320 or 320' by repeating identical pairs of active and dielectric layers, e.g. multilayer structure 320 with identical active layers 312 and 314. Mixed colours, e.g. white, can be emitted by the engineered structure 320', comprising active layers 312 and 314 emitting two or more colours or wavelengths, e.g. several layer pairs for each constituent colour. For example, N pairs of active/dielectric layers altogether may comprise k pairs for blue, m pairs for green, and n pairs for amber/red/orange, where k+m+n=N. The number of each of the colour pairs can be varied so that any desired CRI can be achieved. For example, a warm white requires more pairs of red than blue, while a cool white requires the opposite.

If desired, the active layer 312/314 may comprise semiconductor nanocrystals, e.g. silicon nanocrystals formed by depositing silicon-rich silicon oxide or silicon nitride active layers of a suitable thickness, and thermally treating to form nanocrystals. However, by using the engineered structure 320 or 320' with drift layers 313/315 having a specific thicknesses related to characteristics of the active layer 312/314, as described above, efficient excitation of rare earth luminescent species may be achieved in structures which can be more readily and consistently fabricated. By comparison, it was observed that deposition of active layers 312/314 comprising nanocrystals require careful control of deposition conditions and passivation. By using the engineered emitter layer structure 320 or 320' with drift layers 313/315 having thicknesses specific to respective active layers excitation energies, and appropriate device well 327 and contact structures 323 for better control of electrical excitation, superior performance was observed for engineered emitter structures 320 or 320' using active layers 312/314 comprising rare earth doped silicon dioxide, and rare earth oxides.

Preferably, after deposition of the multilayer emitter layer structure 320 or 320', a barrier layer 340 is deposited thereon before depositing a field oxide layer regions 328. Advantageously, the barrier layer 340 comprises a material which acts as an etch stop during patterning of the overlying field oxide layer regions 328. The barrier layer 340 may simply provide a "seal" before further wafer processing, and may also provide a functional layer, e.g. provide a stopper layer or barrier layer of the device structure.

With a suitable choice of materials, the emitter layer structure 320 or 320', the barrier layer 340 or other optional layers, and field oxide layer regions 328 may be deposited sequentially in the same process equipment, for example by CVD, PECVD, ALE (atomic layer epitaxy) or ALD (atomic layer deposition) and MBE, as mentioned above, although other processes capable of depositing high quality dielectric layers of about ~1 nm to 10 nm thickness may be used. For example, the substrate 311 may be silicon substrate or other substrate compatible with silicon processing. The active layers 312/314 of the emitter layer 320 or 320' structure may comprise rare earth oxides, or rare earth doped dielectrics such as silicon dioxide and silicon nitride. The respective drift layers 313/315 may comprise silicon dioxide. The field dielectric preferably comprises silicon dioxide. A suitable barrier layer 340 comprises a layer of silicon nitride, which not only provides a hot electron stopper layer, as described in related copending applications, but also provides an effective etch stop for etching of device wells 327 in the field oxide. Thus, fabrication is simplified, and improved uniformity of the emitter layer structure 320 or 320' potentially improves device reliability.

As disclosed in related co-pending applications, suitable rare earth luminescent species for different coloured emission include, e.g. terbium (green), cerium (blue) and europium (red). Active layers may comprise one or more rare earth luminescent centres, e.g. one or more of Ce, Pr, Nd, Sm, Eu, Gd, Tb, Dy, Ho, Er, Tm or Yb. Other suitable dielectric host matrix materials for rare earth luminescent centres may comprise alumina, or other aluminum containing dielectrics, e.g. SiAlON. Other group IV compatible semiconductor material that may alternatively be used for host matrix dielectric or drift layer dielectrics are disclosed in U.S. Patent Application no. 2010/0032687, filed 23 Jul. 2009, which is incorporated herein by reference.

Embodiments of the light emitting device structure and methods for fabrication thereof with reduced surface topography are disclosed. Preferred embodiments of the process provide a light emitting device having a substantially planar emitter layer structure, and with improved uniformity. Fabrication is facilitated, and multiple planar layers may be deposited in the same deposition equipment, while process flexibility is increased. Subsequent steps such as patterning and metallization may be completed, e.g. to meet different product design requirements. Patterning of the field oxide to define device wells after deposition of the emitter layer structure provides for large area emitters, e.g. for white light sources and solid-state lighting, or for pixellated light emitting devices, with improved device reliability compared with devices where the emitter layer structure is formed over a non-planar surface topography.

All publications, patents and patent applications cited in this specification are herein incorporated by reference as if each individual publication, patent or patent application were specifically and individually indicated to be incorporated by reference. The citation of any publication is for its disclosure prior to the filing date and should not be construed as an admission that the present invention is not entitled to antedate such publication by virtue of prior invention. All patents and patent applications referred to above are herein incorporated by reference.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A method of fabricating an electroluminescent light emitting device comprising:
   providing a substrate;
   providing an emitter layer structure comprising at least one active layer containing luminescent centres for emitting light of a characteristic wavelength;
   providing field dielectric regions defining a device well of the emitter layer structure;
   providing electrodes for applying an electric field to the emitter layer structure within the device well region, for excitation of light emission, one of said electrodes extending from the device well over a field dielectric region adjacent the device well, and
   providing an electrical contact to said electrode over the field oxide region;
   wherein the step of providing the field dielectric regions comprises depositing a field dielectric layer over the emitter layer structure, and patterning the field dielectric layer to form the field dielectric regions defining the device well region of the emitter layer structure; and
   wherein the step of providing the emitter layer structure comprises depositing a layer stack comprising at least one layer pair comprising an active layer and a respective drift layer adjacent the active layer, wherein each active layer comprises luminescent centres in a host matrix material, and each respective drift layer comprises a dielectric or wide bandgap semiconductor.

2. A method according to claim 1, wherein the substrate has a substantially flat surface, and the step of depositing the emitter layer structure on the substrate surface provides a substantially planar emitter layer structure.

3. A method according to claim 1, further comprising depositing a barrier layer before the step of depositing the field dielectric layer, the barrier layer comprising at least one of an etch stop layer and a stopper layer.

4. A method according to claim 1, wherein the step of patterning the field dielectric layer comprises tapering sidewalls of the dielectric regions around the device well.

5. A method according to claim 1, wherein the dielectric host matrix material comprises one of silicon dioxide, silicon nitride, silicon oxynitride and a rare earth oxide,
   wherein each respective drift layer comprises silicon dioxide or silicon nitride, and
   wherein depositing the field dielectric layer comprises depositing a layer of silicon dioxide.

6. A method according to claim 5, wherein the steps of providing the emitter layer structure and providing the field dielectric layer are conducted sequentially in the same deposition apparatus, before subsequent patterning of the field dielectric layer.

7. A method according to claim 6, further comprising depositing a barrier layer before deposition of the field dielectric layer.

8. A method according to claim 6, further comprising depositing the layer stack comprising one or more of a transition layer, a reflective layer, a conductive layer, a stopper layer and a barrier layer.

9. A method according to claim 5, wherein the step of providing the emitter layer structure comprises depositing each active layer having a predetermined thickness in the range from about 1 nm to 10 nm, and depositing each respective drift layer with a respective thickness, for a predetermined electric field for operation of the device, which is matched in proportion to an excitation energy of an adjacent active layer for exciting light emission at the characteristic wavelength.

10. An electroluminescent light emitting device comprising:
    a substrate;
    an emitter layer structure comprising at least one active layer containing luminescent centres for light emission at a characteristic wavelength,
    field dielectric regions defining a device well of the emitter layer structure; and
    electrodes for applying an electric field to the emitter layer structure within the device well region for excitation of light emission, one of said electrodes extending from the device well over the field dielectric regions adjacent the device well, and an electrical contact to said electrode overlying said field oxide region;
    wherein the emitter layer structure comprises at least one layer pair comprising an active layer and a respective drift layer, wherein each active layer contains rare earth luminescent centers in a host matrix for emitting light of a characteristic wavelength on excitation with a respective excitation energy, and each respective drift layer comprises a dielectric or wide band gap semiconductor material.

11. A device according to claim 10, wherein the emitter layer structure extends over the substrate and the field dielectric regions overlie the emitter layer structure around the device well of the emitter layer structure.

12. A device according to claim 11, wherein sidewalls of the field dielectric regions are tapered around the device well.

13. A device according to claim 11, further comprising a barrier layer underlying the field dielectric regions.

14. A device according to claim 11 wherein the substrate has a substantially flat surface, and the emitter layer structure comprises a substantially planar layer stack provided thereon.

15. The device according to claim 10, wherein the field dielectric regions are provided on the substrate to define the device well, and the emitter layer structure extends over the substrate in the device well and over the field dielectric regions.

16. The device according to claim 15, wherein sidewalls of the field dielectric regions are tapered around the device well.

17. The device according to claim 10, wherein the field dielectric regions have a thickness which is two to ten times the thickness of the emitter layer structure.

18. The device according to claim 10, wherein the field dielectric regions comprise a grid pattern defining a plurality of device well regions of the emitter layer structure.

19. The device according to claim 18, wherein the device well regions are 5 microns to 5000 microns wide.

20. A device according to claim 10, wherein said electrodes comprise a bottom electrode provided by a conductive layer of the substrate underlying the device well.

21. A device according to claim 10, wherein each active layer comprises rare earth luminescent centres in a dielectric host matrix comprising one of silicon dioxide, silicon nitride, silicon oxynitride and a rare earth oxide, and each drift layer comprises silicon dioxide or silicon nitride, and wherein the field dielectric regions comprise silicon dioxide.

22. A device according to claim 21, further comprising a barrier layer comprising silicon nitride underlying the field dielectric regions.

23. A device according to claim 10, wherein the emitter layer structure comprises a layer stack of a plurality of active layer and respective drift layer pairs, each active layer having a predetermined thickness in the range from about 1 nm to 10 nm, and each respective drift layer having a thickness, for a predetermined electric field for operation of the device, which is matched in proportion to an excitation energy of an adjacent active layer for exciting light emission at the characteristic wavelength.

24. The device according to claim 10, wherein the emitter layer structure comprises a plurality of first active layers and a plurality of respective first drift layers, each first active layer having a predetermined thickness in the range from about 1 nm to 10 nm, and each respective first drift layer having a thickness, relative to the predetermined electric field for operation of the device, which is dependent on an excitation energy of the adjacent first active layer for exciting light emission at a first characteristic wavelength.

25. The device according to claim 24, wherein the emitter layer structure further comprises a plurality of second active layers and a plurality of respective second drift layers, each second active layer having a predetermined thickness in the range From about 1 nm to 10 nm, and each respective second drift layer having a thickness different than the first drift layers, relative to the predetermined electric field for operation of the device. which is dependent on an excitation energy of the adjacent second active layer for exciting light emission at a second characteristic wavelength different than the first characteristic wavelength.

* * * * *